United States Patent
Etori

(10) Patent No.: US 8,298,752 B2
(45) Date of Patent: Oct. 30, 2012

(54) METHOD FOR PRODUCING SURFACE CONVEXES AND CONCAVES

(75) Inventor: Hideki Etori, Saitama (JP)

(73) Assignee: Kimoto Co., Ltd. (JP)

( * ) Notice: Subject to any disclaimer, the term of this patent is extended or adjusted under 35 U.S.C. 154(b) by 578 days.

(21) Appl. No.: 12/530,992

(22) PCT Filed: Mar. 19, 2008

(86) PCT No.: PCT/JP2008/055092
§ 371 (c)(1),
(2), (4) Date: Sep. 11, 2009

(87) PCT Pub. No.: WO2008/117719
PCT Pub. Date: Oct. 2, 2008

(65) Prior Publication Data
US 2010/0044913 A1 Feb. 25, 2010

(30) Foreign Application Priority Data

Mar. 26, 2007 (JP) ................................ 2007-078291

(51) Int. Cl.
*G02B 5/02* (2006.01)
(52) U.S. Cl. .......................... 430/320; 430/321; 430/325
(58) Field of Classification Search .......................... None
See application file for complete search history.

(56) References Cited

U.S. PATENT DOCUMENTS

| | | | |
|---|---|---|---|
| 4,877,717 A | 10/1989 | Suzuki et al. ................. | 430/321 |
| 6,324,149 B1 | 11/2001 | Mifune et al. ............ | 369/112.01 |
| 7,320,535 B2 | 1/2008 | Etori ............................. | 362/335 |
| 2003/0209819 A1* | 11/2003 | Brown et al. .................. | 264/2.5 |
| 2008/0072708 A1 | 3/2008 | Abe et al. ..................... | 76/107.1 |

FOREIGN PATENT DOCUMENTS

| | | |
|---|---|---|
| JP | 2003-066615 | 3/2003 |
| JP | 2004-294745 | 10/2004 |
| JP | 2004-310077 | 11/2004 |
| JP | 2006-003519 | 1/2005 |
| JP | 2006-162886 | 6/2006 |
| JP | 2006-308960 | 11/2006 |

* cited by examiner

*Primary Examiner* — John A. McPherson
(74) *Attorney, Agent, or Firm* — Bacon & Thomas, PLLC

(57) ABSTRACT

A method for producing surface convexes or concaves disposes a mask member having light transmitting sections and non-light transmitting sections over and spaced from one side of a photosensitive film including a photosensitive resin composition, and a light diffusing member is disposed on the opposite side of the photosensitive film across the mask member. Light is irradiated from a light source disposed on the opposite side of the mask member across the light diffusing member to subject the photosensitive film to light exposure through the light diffusing member and the light transmitting sections of the mask member. Exposed portions or unexposed portions of the photosensitive film are removed by development to produce convexes or concaves on the photosensitive film in shapes determined by shapes of the exposed portions or unexposed portions. In exposure, conditions such as haze of the light diffusing member are controlled to control the shapes of the exposed portions or unexposed portions.

13 Claims, 9 Drawing Sheets

METHOD FOR PRODUCING SURFACE CONVEXES AND CONCAVES

BACKGROUND OF THE INVENTION

1. Technical Field

The present invention relates to a method for producing fine convexes or concaves, in particular, a method for producing surface convexes or concaves suitable for manufacturing optical materials, which comprises a transparent material having surface convexes or concaves, such as light diffusing panels, light control films and microlenses.

2. Background Art

For various optical apparatuses, screens and displaying apparatuses such as liquid crystal displays, there are used optical materials such as light diffusing films and microlenses, in which fine convexes or concaves are provided on surfaces in order to control projection directions of transmitted light or reflected light. As such optical materials, there have been proposed not only those simply having random convexes or concaves, but also those having concaves or convexes of which shapes, intervals and so forth are highly precisely defined in order to control light paths (Patent document 1).

Generally employed as techniques for providing convexes or concaves on surfaces of materials are chemical matting in which a matting agent is mixed in a layer forming a surface, embossing, impressing and so forth. However, in the chemical matting, the matting agent itself has particle size distribution, and in addition, dispersion state thereof is not also completely uniform. Therefore, surface profiles having regularity or highly precisely defined surface profiles cannot be formed. In the cases of embossing and impressing, although production of molds may be difficult depending on shapes of convexes or concaves, they have an advantage that if a mold is once produced, surface convexes or concaves can be easily formed thereafter. However, the same surface convexes or concaves cannot necessarily be formed even with the same mold depending on properties of materials, pressures at the time of pressing and so forth, and it is difficult to form convexes or concaves with good reproducibility on any materials.

There are also proposed methods of producing light diffusing panels or microlenses by utilizing photolithography, which is a common technique in the manufacture of semiconductor devices and so forth, (Patent documents 2 and 3). In the technique disclosed in Patent document 3, a gray scale mask pattern is used to control thickness of resist to be solubilized by light exposure, and thereby produce microlenses having convexes of desired shapes. The gray scale mask is a mask in which light transmission distribution is formed by providing a pattern of tones, and a gray scale mask of which light transmission is controlled by changing size or numbers of apertures provided in the mask film is disclosed in Patent document 3.

Patent document 1: International Patent Publication WO2004/021052
Patent document 2: Japanese Patent Unexamined Publication (KOKAI) No. 2004-294745
Patent document 3: Japanese Patent Unexamined Publication No. 2004-310077

SUMMARY OF THE INVENTION

Object to be Achieved by the Invention

However, in a gray scale mask which controls light transmission by controlling size and number of apertures, many apertures of which pitches and sizes are controlled must be provided in a small region in order to form one convex or concave, and even when a reduction projection type light exposure apparatus is used, extremely precise processing is required for the production of the mask. Moreover, in order to form convex/concave shapes with a continuous curved surface having no steps, it is necessary to perform multiplex light exposure using multiple kinds of masks, and thus the process of convex/concave formation becomes complicated.

Therefore, an object of the present invention is to provide a method enabling easy and highly precise formation of desired convex/concave shapes by using a usual photomask without using a gray scale mask.

Means for Achieving the Object

The method for producing surface convexes or concaves of the present invention is a method for producing fine convexes or concaves on a surface of a material, which comprises the step of disposing a mask member having light transmitting sections and non-light transmitting sections over one side of a photosensitive film consisting of a photosensitive resin composition with an interval with respect to the photosensitive film, the step of disposing a light diffusing member on the opposite side of the photosensitive film across the mask member, the step of exposing the photosensitive film through the light diffusing member and the light transmitting sections of the mask member by irradiating light from a light source disposed on the opposite side of the mask member across the light diffusing member, and the step of removing exposed portions or unexposed portions of the photosensitive film by development to produce convexes or concaves on the photosensitive film in shapes determined by shapes of the exposed portions or unexposed portions, wherein in the step of exposure, light exposure conditions are controlled so as to control the shapes of the exposed portions or unexposed portions.

In the method for producing surface convexes or concaves of the present invention, the light exposure conditions may include haze (JIS K7136:2000) of the light diffusing member.

In the method for producing surface convexes or concaves of the present invention, the light exposure conditions may include distance from a light shielding surface of the mask member to the photosensitive film.

In the method for producing surface convexes or concaves of the present invention, the photosensitive film may consist of a negative type photosensitive resin composition which is insolubilized by light exposure.

In the method for producing surface convexes or concaves of the present invention, the photosensitive film may be formed on or disposed in contact with a substantially transparent first base material, and the light exposure may be performed from the side of the first base material.

In the method for producing surface convexes or concaves of the present invention, after the step of exposure, the surface of the photosensitive film on the mask member side may be adhered to a second base material, and then development may be performed to produce a surface having convexes or concaves on the second base material.

The method for producing surface convexes or concaves of the present invention may also be a method for producing a member having surface convexes or concaves by using a mold having fine surface convexes or concaves so that the member should have surface convexes or concaves in shapes complementary to shapes of the surface convexes or concaves formed on the mold, wherein a mold produced by the aforementioned method for producing surface convexes or concaves of the present invention is used as the mold.

The method for producing surface convexes or concaves of the present invention may also be a method for producing a member having surface convexes or concaves by using a mold having fine surface convexes or concaves so that the member should have surface convexes or concaves in shapes complementary to shapes of the surface convexes or concaves formed on the mold, wherein a second mold produced by using a first mold produced by the aforementioned method for producing surface convexes or concaves of the present invention is used as the mold to produce the member having convexes or concaves in the same shapes as those of the first mold.

In the method for producing surface convexes or concaves of the present invention, the member on which surface convexes or concaves are formed may be an optical member.

In the present invention, light includes not only visible lights but also ultraviolet rays and far ultraviolet rays.

Hereafter, the concept of the present invention will be explained.

In photolithography aiming at forming convexes or concaves in a certain film thickness such as photolithographic platemaking, in order to accurately reproduce a mask pattern, it is required that light used for light exposure should be parallel light. Also in the conventional methods for producing surface convexes or concaves using a gray scale mask, distribution is imparted to light exposure of the exposed portions by controlling light transmission of the mask on the assumption that the light is parallel light.

Further, for formation of special convex/concave shapes in which height of the convex (film thickness) is high, a technique is also proposed in which resist (photosensitive film) is formed on a transparent substrate, and light exposure is performed from the substrate side (back side) in order to prevent underexposure and underdevelopment (Patent document 4). However, in order to prevent collapse of edge shapes of the exposed portions of the resist due to diffraction of light, the mask is generally disposed in contact with the resist.
Patent document 4: Japanese Patent Unexamined Publication No. 2000-103062

In contrast, in the method for producing surface convexes or concaves of the present invention, although parallel light is used, a mask member and a photosensitive film (resist) are not disposed in contact with each other, but the mask member is disposed with an interval, and a light diffusing member is further disposed on the opposite side of the photosensitive film across the mask member. By utilizing spread of light diffused by the light diffusing member, distribution of light exposure is imparted. Further, the spread of light generated by diffusion of light is controlled by controlling haze of the light diffusing member to control distribution of light exposure, i.e., shapes of convexes or concaves formed by the light exposure.

That is, as shown in FIGS. 1 and 2, when parallel light is irradiated on the photosensitive film 10 through the light diffusing member 30 and the mask member 20, the parallel light is diffused by the light diffusing member 30, and therefore the light passing through a light transmitting section (aperture) of the mask member 20 spreads to be broader than the diameter of the aperture. This spread of light varies depending on the value of haze H of the light diffusing member 30, and therefore distribution is imparted to amount of light, for example, amount of light decreases in peripheral portions of the light flux passing through the light transmitting section of the mask member.

Further, after the light diffused by the light diffusing member 30 passes through the light transmitting section of the mask member 20, spread of the light is expanded according to the distance T from the light shielding surface of the mask member 20 to the photosensitive film 10 (arrows a of broken lines shown in FIGS. 1 and 2), and amount of light per unit area decreases in peripheral portions of the light flux compared with a central portion of the light flux. Moreover, the light which passes through the light transmitting section of the mask member 20 spreads by diffraction according to the distance T from the light shielding surface of the mask member 20 to the photosensitive film 10 (arrows b of fine broken lines shown in FIGS. 1 and 2), and amount of light per unit area decreases in peripheral portions of the light flux compared with a central portion of the light flux.

As described above, even after the light passes through the light transmitting section of the mask member 20, distribution is further imparted by diffraction, for example, amount of light per unit area decreases in peripheral portions of the light flux compared with a central portion of the light flux.

Distribution of light finally reaching the photosensitive film 10 (distribution of light exposure) changes depending on the haze H of the light diffusing member 30 and the distance T from the light shielding surface of the mask member 20 to the photosensitive film 10.

When the distance t between the light diffusing member 30 and the light shielding surface of the mask member 20 and the size of the light transmitting section of the mask member 20 are sufficiently small compared with the size of the region irradiated with the parallel light, the distance does not affect the amount of light entering into the light transmitting section of the mask member 20 and diffusion degree. That is, when the distance t changes from that shown in FIG. 1 to that shown in FIG. 2, the distance becomes longer in FIG. 2, and therefore intensity of diffused light a entering into the light transmitting section of the mask shown in FIG. 1 decreases in FIG. 2 in inverse proportion to the square of the distance t. However, decrease of the intensity is compensated by increase of diffused light entering into the aperture in the case shown in FIG. 2. That is, it can be seen that, even if the distance t changes, conditions of light (amount of light, degree of diffusion) shown in FIGS. 1 and 2 are not different after the light passes thorough the light transmitting section.

As described above, distribution of light entering into the photosensitive film (distribution of light exposure) depends on the haze H of the light diffusing member and the distance T from the light shielding surface of the mask member to the photosensitive film.

Light exposure required for photocuring of a photocurable resin (resist) is called critical light exposure Ec, and it is known that there is a relation represented by the following equation between curing depth Cd of a photocurable resin at the time of subjecting a predetermined light exposure E0 to the resin and the critical light exposure Ec.

$$Cd = Dp \times \ln(E0/Ec) \quad (1)$$

In the equation, Dp represents a depth at which intensity of ultraviolet ray irradiated on the resin surface becomes l/e (it is called penetration depth), and Dp is a value characteristic to each resin.

Therefore, when light is irradiated so as to generate light exposure distribution, curing depth distribution is produced corresponding to the light exposure distribution, and as a result, it becomes possible to form convexes or concaves having varying height or depth. In the present invention, by controlling light exposure distribution by controlling the haze H of the light diffusing member (henceforth also referred to simply as "haze H"), or by controlling the haze H and the distance T from the light shielding surface of the mask member to the photosensitive film (henceforth also referred to simply as "distance T"), formation of desired surface convexes or concaves is enabled.

Effect of the Invention

According to the present invention, a desired convex/concave pattern can be produced with high precision by controlling the conditions of light exposure without performing multiplex light exposure or light exposure using a gray scale mask or the like.

EXPLANATIONS OF NUMERAL NOTATIONS

10 . . . Photosensitive film
11 . . . Base material
20 . . . Mask member,
30 . . . Light diffusing member

DESCRIPTION OF THE PREFERRED EMBODIMENTS

Hereafter, embodiments of the present invention will be explained.

Figure 3:
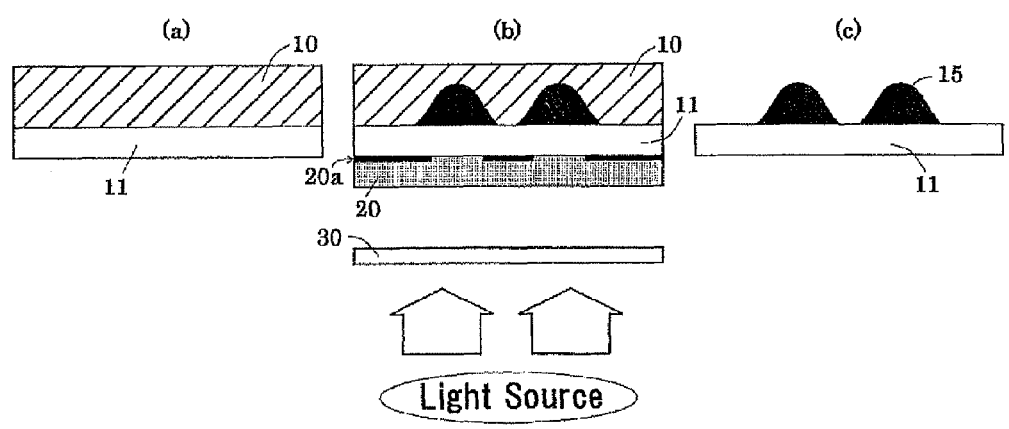

The outline of the method for producing surface convexes or concaves of the present invention is shown in FIG. 3. The method for producing surface convexes or concaves of the present invention mainly comprises the step (a) of preparing a photosensitive film 10 consisting of a photosensitive resin composition which is cured or solubilized by light exposure, the light exposure step (b) of exposing the photosensitive film 10 to light through a light diffusing member 30 and a mask member 20, and the development step (c) of developing the exposed photosensitive film 10 to remove exposed portions or unexposed portions.

In the light exposure step, as shown in FIG. 3, (b), the mask member 20 is disposed with a predetermined interval with respect to the photosensitive film 10, the light diffusing member 30 is disposed on the opposite side of the photosensitive film 10 across the mask member 20, and light from a light source is irradiated on the photosensitive film 10 through the light diffusing member 30 and the light transmitting section of the mask member 20 to perform light exposure. In the drawings, although the photosensitive film 10 is formed on a base material 11, the base material 11 is not indispensable. In the development step, the photosensitive film 10 is developed to remove exposed portions or unexposed portions and thereby form convexes or concaves 15, of which shapes are determined by the shapes of exposed portions or unexposed portions, on the photosensitive film 10. Then, portions of the photosensitive film not removed and remained are cured (insolubilized) as required. In the method for producing surface convexes or concaves of the present invention, the shapes of the convexes or concaves are controlled by appropriately choosing the haze H, preferably the haze H and the distance T.

The haze H of the light diffusing member is changed according to intended convex/concave shapes. With a smaller haze, a larger aspect ratio (ratio of height to width of the bottom) of exposed portion can be obtained, i.e., a higher convex shape is obtained with a negative type photosensitive composition of which exposed portions are insolubilized to provide convexes, and a deeper concave shape is obtained with a positive type photosensitive composition of which exposed portions are solubilized to provide concaves.

The haze includes haze induced by surface unevenness of the light diffusing member (henceforth referred to as "external haze"), and haze induced by difference of refractive indexes of binder resin and light diffusing agent in the light diffusing member (henceforth referred to as "internal haze"). The concave/convex shapes can be changed by choosing which is used, the external haze or the internal haze. Specifically, if a convex shape is formed by using external haze, inclination thereof gradually becomes larger from the peak to the foot, and the bottom does not spread so much. Therefore, there is a tendency that concave/convex shapes of large aspect ratios are obtained. On the other hand, if a convex shape is formed by using internal haze, the peak portion having a small inclination becomes relatively wide, inclination suddenly becomes large toward the foot, and then becomes small again, and the bottom spreads markedly. Therefore, there is a tendency that the aspect ratio becomes smaller.

Therefore, from the comparison of them, it can be seen that the external haze is responsible for sectional shape of a portion relatively close to the peak of convex, and the internal haze is responsible for sectional shape of a portion relatively close to the foot. By using such tendencies, it can be determined to use external haze or internal haze depending on the intended concave/convex shape. Furthermore, both external haze and internal haze can also be used in combination, and in such a case, concave/convex shapes showing the tendencies in combination can be obtained.

Figure 1:
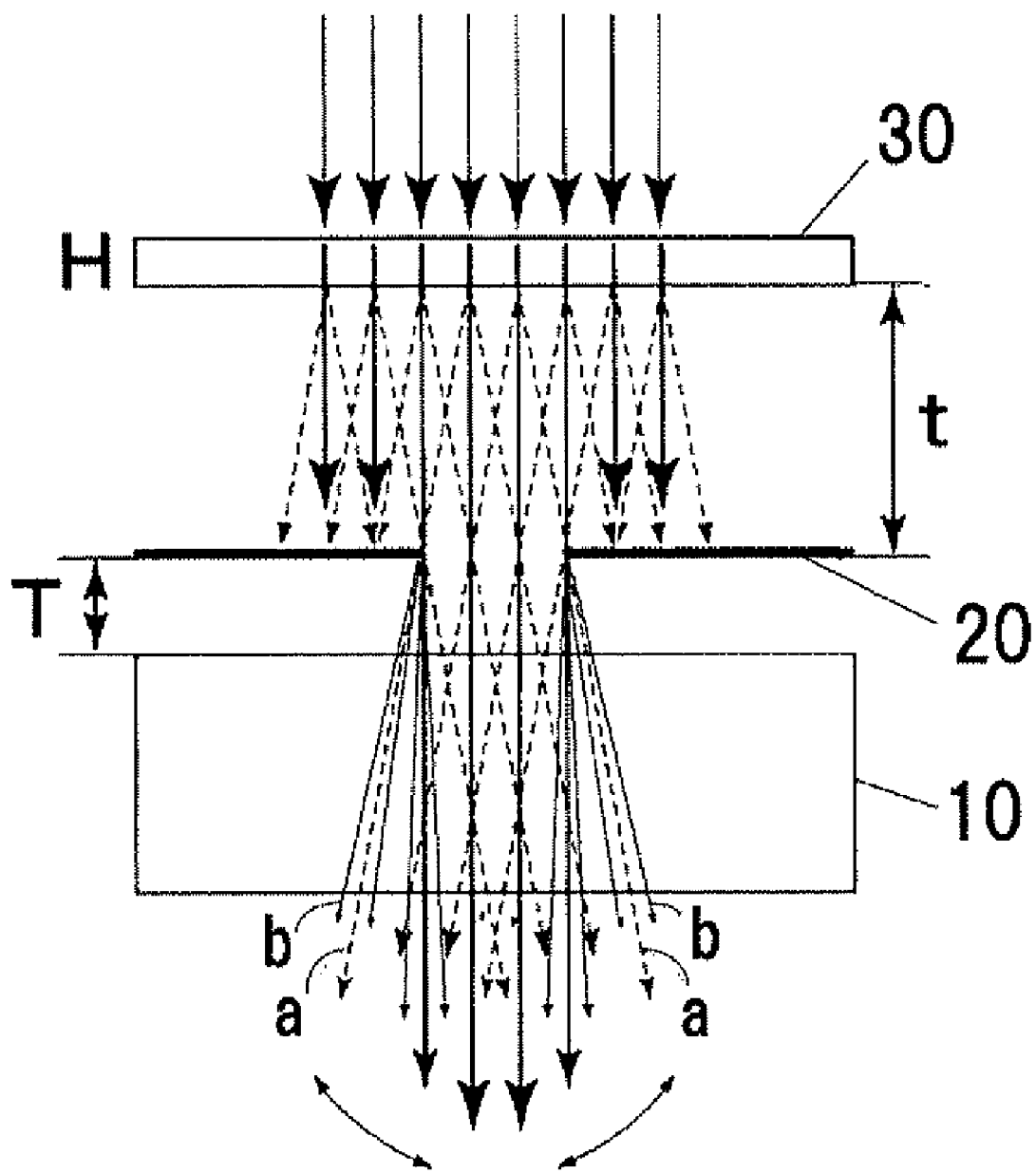
FIG. 1 Drawing for explanation of the principle of the formation of convexes or concaves according to the present invention FIG. 2 Drawing for explanation of the principle of the formation of convexes or concaves according to the present invention FIG. 3 Drawings showing an embodiment of the method for producing surface convexes or concaves of the present invention FIG. 4 Graphs showing change of convex shape depending on external haze H with fixed distance T FIG. 5 Graphs showing change of convex shape depending on internal haze H with fixed distance T FIG. 6 Graphs showing change of convex shape depending on distance T with fixed external haze H FIG. 7 Graphs showing change of convex shape depending on distance T with fixed internal haze H FIG. 8 Microphotographs showing specific examples of convexes having different shapes and aspect ratios FIG. 9 Drawings showing another embodiment of the method for producing surface convexes or concaves of the present invention FIG. 10 Drawings showing one step of the method for producing surface convexes or concaves of the present invention
Figure 2:
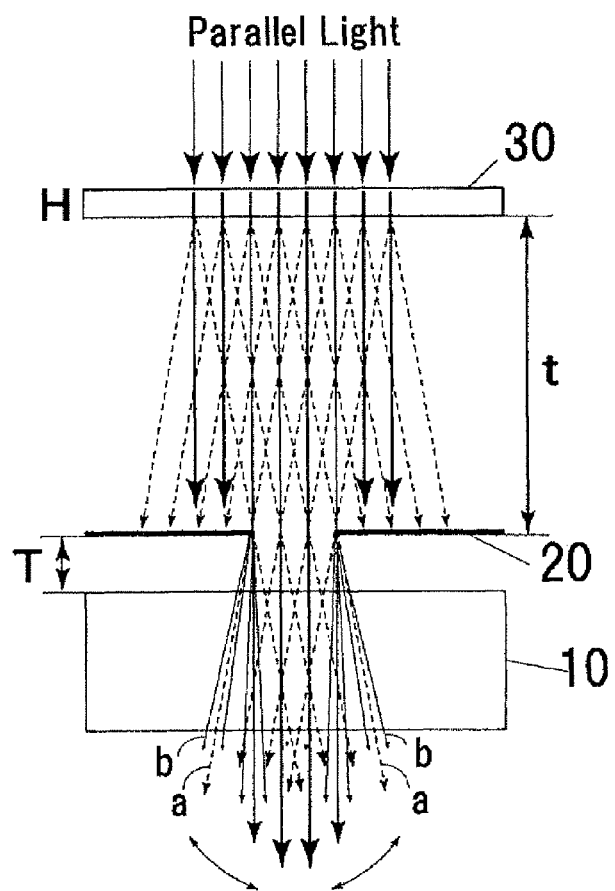

As for the distance T from the light shielding surface of the mask member to the photosensitive film, although it depends on objective convex/concave shapes, when sizes (height and width of bottom) of the convexes or concaves are in the order of submicron to several hundreds microns, T/N (N is a refractive index of a medium existing between the light shielding surface of the mask member and the photosensitive film) is preferably 2 mm or smaller, more preferably not smaller than 5 μm and not lager than 1 mm. The distance T is divided with the refractive index N, because the wave number becomes larger as the refractive index becomes larger, and the wave number needs to be the same in order to obtain the same effect of the spread of light by diffraction. In the design of the same convex/concave shapes, when a medium of a smaller refractive index is used, for example, the interval (thickness of the material) should be thinner compared with the case where a higher refractive index medium is used. Further, when two or more kinds of media are used, it is sufficient that T1/N1+T2/N2+ . . . should be within the aforementioned range, wherein T1, T2 . . . and N1, N2, . . . represent thicknesses and refractive indexes of the media, respectively. On the other hand, as also seen from FIGS. 1 and 2, the spread of light by diffusion is proportional to the distance T, and is not affected by the refractive index of the medium existing between them. Therefore, in order to obtain a required shape, the distance T is appropriately adjusted in consideration of the spread of the light by diffusion and diffraction. Further, the distance does not need to be constant for all of convexes or concaves, and one-dimensional or two-dimensional gradient may be imparted to the distance, or it is also possible to change the distance itself depending on the position thereof.

As for the distance t from the light diffusing member to the light shielding surface of the mask member, if the size of parallel light (area of the mask irradiated by parallel light) is sufficiently large relative to the distance t, the distance t does not affect the condition of the light after it passes through the aperture of the mask, as described above. However, in order to make the size of parallel light required for light exposure of a large area small, the distance is preferably about 100 mm or smaller.

The shape of the aperture of the mask member is not limited to a circular shape, and it may have an arbitrary shape. For example, when the aperture of the mask member has a slit shape, the convex or concave becomes to have an elongated shape. Further, arrangement and pitches of the convexes or concaves are determined by arrangement and pitches of the apertures formed in the mask.

Sectional shapes of convexes obtained by performing light exposure and development using a negative type photosensitive resin and two kinds of masks having circular apertures with a diameter of 30 μm or 40 μm are shown in FIGS. 4 to 7. The unit is "μm" for the vertical axes and horizontal axes of all the drawings shown in FIGS. 4 to 7. The light exposure was 100 mJ/cm², and the distance t between the light diffusing member and the light shielding surface of the mask member was 8.3 mm for all the cases.

Figure 4:
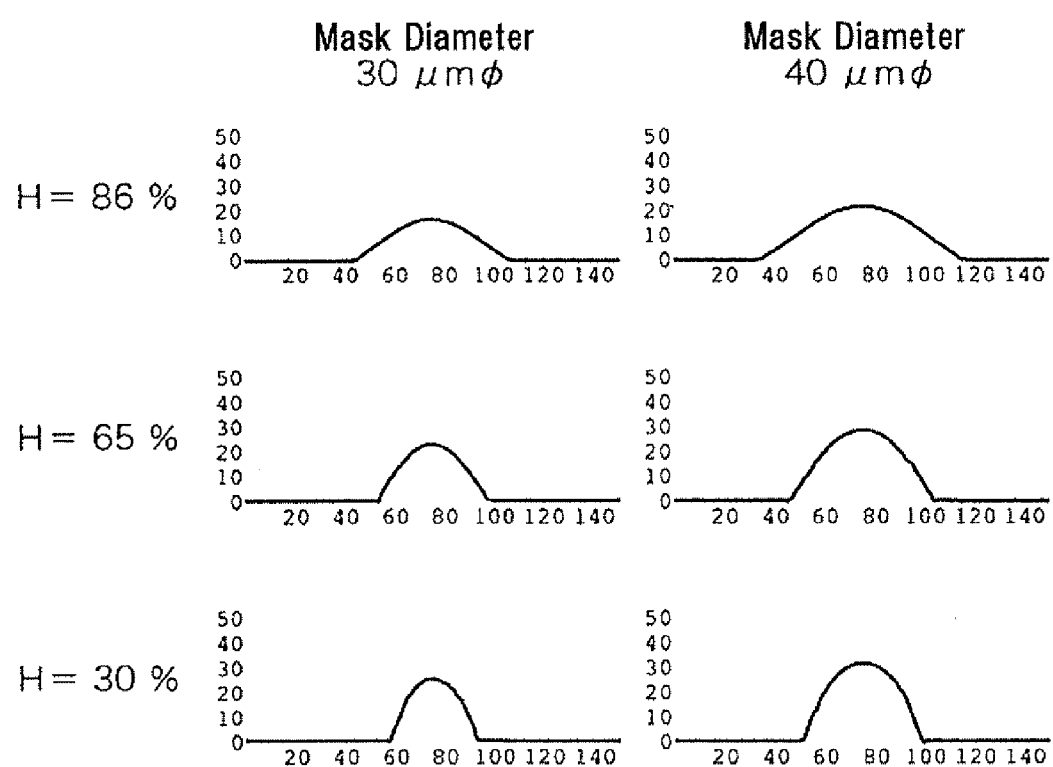
Figure 5:
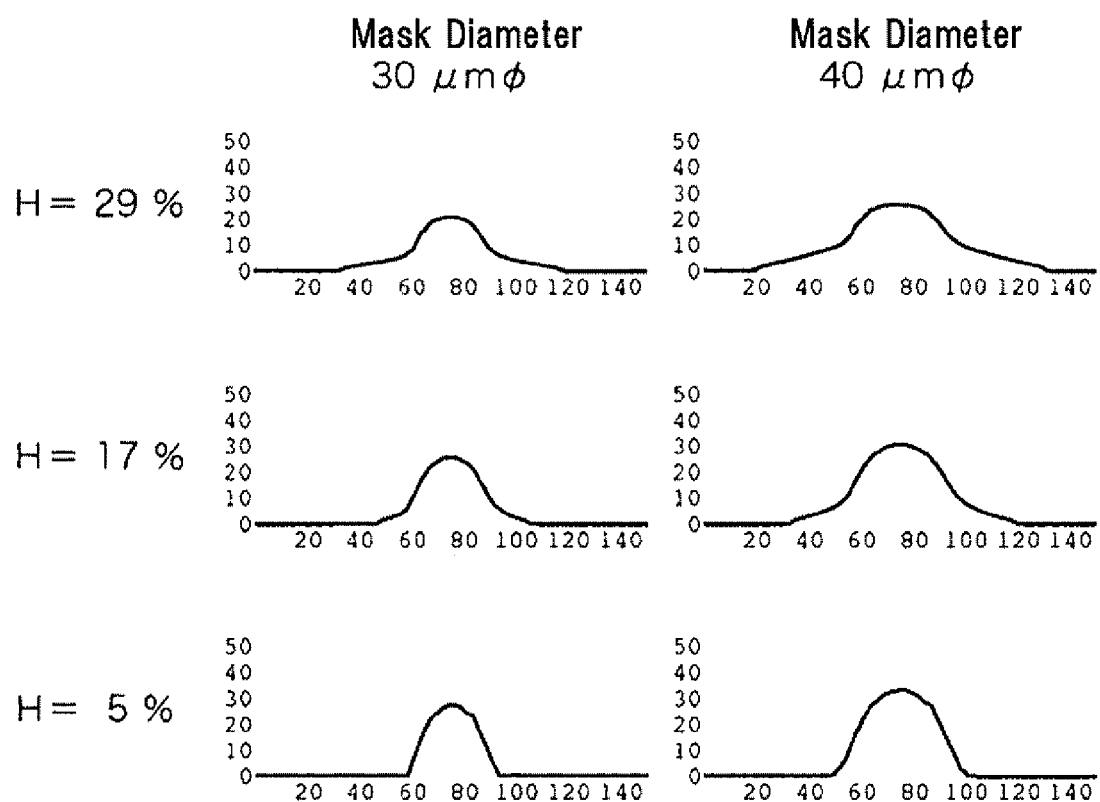
Figure 6:
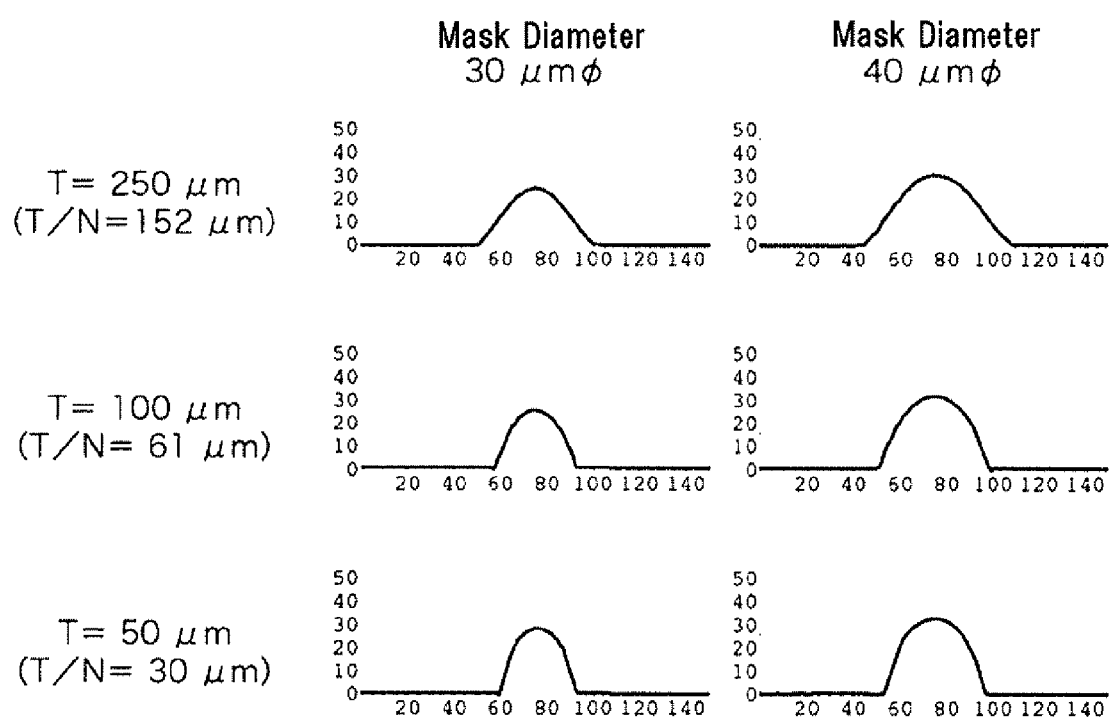
Figure 7:
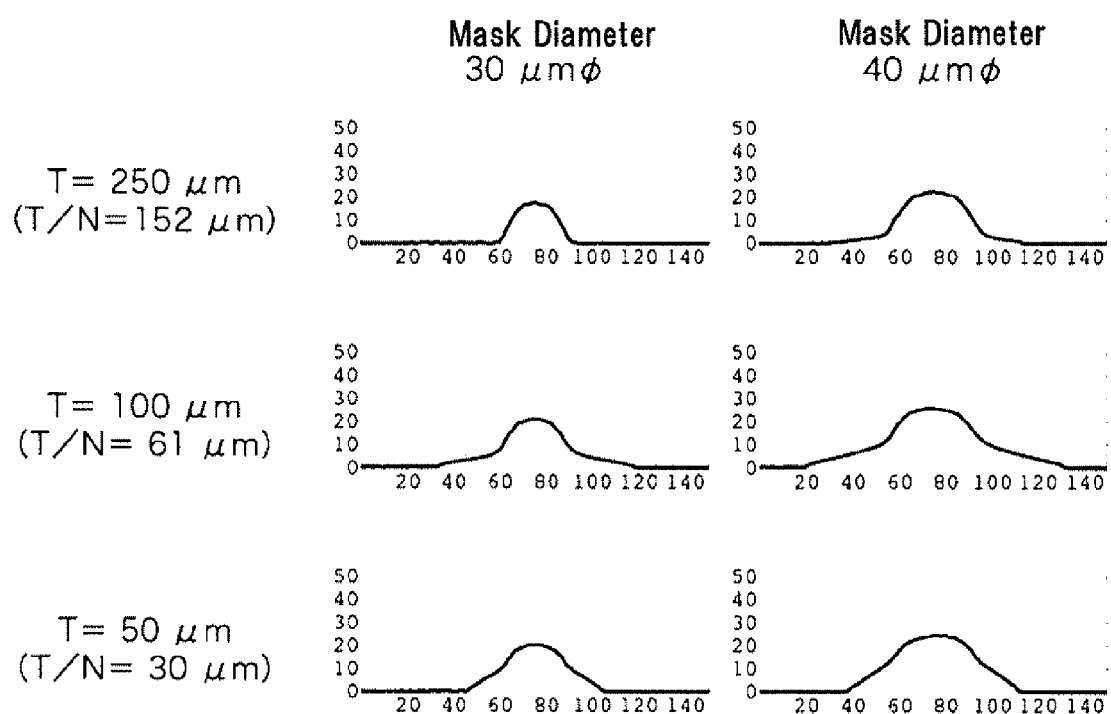

FIG. 4 shows sectional shapes of convexes obtained with a fixed distance T of 100 μm (T/N=61 μm) but changing haze H (external haze). FIG. 5 shows sectional shapes of convexes obtained with a fixed distance T of 100 μm (T/N=61 μm) but changing haze H (internal haze). FIG. 6 shows sectional shapes of convexes obtained with a fixed haze H (external haze) of 30% but changing distance T (T/N). FIG. 7 shows sectional shapes of convexes obtained with a fixed haze H (internal haze) of 29% but changing distance T (T/N).

As shown in FIGS. 4 and 5, when the haze H is changed with fixing the distance T (T/N), as the value of haze becomes larger, spread of light becomes larger, and therefore the shapes of the obtained convexes show a tendency that the height of the convex becomes lower, the bottom spreads, and thus the aspect ratio becomes smaller, in both the cases using external haze and internal haze.

However, the sectional shapes of the convexes obtained by using external haze and internal haze also show different tendencies. In the case of using the light diffusing member having external haze (FIG. 4), there is a tendency that inclination of slope becomes gradually larger from the peak to the foot of the convex, irrespective of the value of haze H. On the other hand, in the case of using the light diffusing member having internal haze (FIG. 5), there is a tendency that the convex peak portion having a small inclination has a relatively large area, and inclination suddenly becomes large toward the foot, and becomes small again, and the bottom markedly spreads. This tendency becomes more significant as the haze value H becomes larger.

As for the range of the haze value giving difference of convex shape, when external haze was used, the shape changed with change of the haze in a wide range of 30% to a relatively high haze value, 86% (although not shown, convex shapes obtained with an external haze lower than 30% were not significantly different from that obtained with the convex shape obtained with a haze value of 30%). On the other hand, when internal haze was used, the shape also changed with change of the haze in a relatively narrow range of haze values lower than 30%. In particular, from the comparison of the shape obtained with a haze value H of 30% shown in FIG. 4 and the shape obtained with a haze value H of 29% shown in FIG. 5, it can be seen that, even if substantially the same haze values are used, the shapes obtained with light diffusing members having external haze and internal haze are greatly different from each other.

FIGS. 6 and 7 show shapes of convexes obtained with a fixed haze value H while changing distance T (T/N). In both of the cases using light diffusing members having external haze and internal haze, as the distance T (T/N) becomes larger, spread of light becomes larger. Therefore, there is a tendency that as the value of the distance T (T/N) increases, the obtained convex has a smaller height, a more spreading bottom, and thus a smaller aspect ratio.

The haze values in FIGS. 6 and 7, 30% and 29% respectively, are substantially the same conditions. However, when the light diffusing member having external haze is used (FIG. 6), there is a tendency that inclination of slope of the convex gradually becomes larger from the peak to the foot, and as the distance T (T/N) becomes larger, inclination of slope becomes smaller, for all the values of the distance T (T/N). On the other hand, when the light diffusing member having internal haze is used (FIG. 7), there is a tendency that the convex peak portion having a small inclination has a relatively large area, inclination suddenly becomes large toward the foot, and becomes small again, and the bottom markedly spreads. As for the inclination from the peak to the foot, there is a tendency that as the distance T (T/N) becomes larger, the portion having large inclination at the center of the slope becomes longer, and inclination of the portion having a small inclination at the foot becomes further smaller. In FIG. 7, the bottom of the convex obtained with T=250 μm is smaller than that of the convex obtained with T=100 μm, and it is considered that this is because the light irradiated on the portion having a small inclination at the foot was unduly diffused when T was 250 μm, and did not reach the critical light exposure to cause uncuring of the photosensitive resin.

Figure 8:
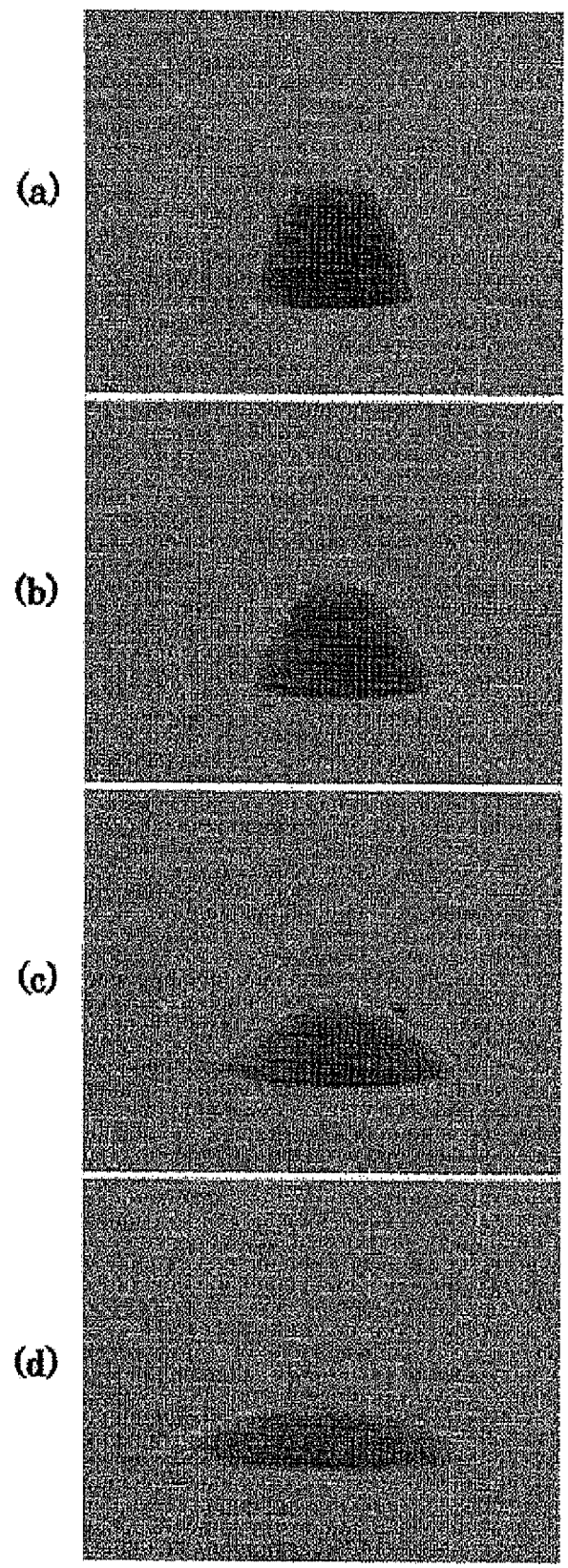

Specific examples of convexes obtained with circular apertures of the mask member are shown in FIG. 8, which are different in shape and aspect ratio (ratio of height to bottom width of convex). Although single convexes are shown in the drawings as examples, multiple fine convexes are formed by using a mask having multiple fine apertures (light transmitting sections).

As described above, in the method for producing surface convexes or concaves of the present invention, sectional shape and aspect ratio (ratio of height to bottom width of convex) of convex or concave can be controlled by adjusting the haze H, distance T, and light energy of light source (light exposure) in the light exposure step.

In the development step, a solvent which dissolves the photosensitive resin composition constituting the photosensitive film is used as a developing solution to remove portions of the photosensitive film other than those insolubilized by the light exposure (negative type). Alternatively, portions solubilized by the light exposure are removed (positive type). In both cases, by means of exposing the photosensitive film formed on a transparent base material (first base material) to light through that base material, and then developing the surface of the photosensitive film (surface on the side opposite to the side of the base material), fine concaves or convexes can be formed on the surface. Then, portions of the photosensitive film not removed and remained are further cured as required. When the base material (first base material) is not used, one surface of the photosensitive film, for example, the surface thereof on the mask member side, may be adhered to another base material (second base material) after the light exposure step and before the development step. Moreover, even when the base material (first base material) is used, the base material may be disposed on the opposite side of the mask member, then after light exposure from the photosensitive film side, the surface of the photosensitive film on the mask member side may be adhered to another base material (second base material) after the light exposure step and before the development step, and the original base material (first base material) may be delaminated.

Hereafter, the materials used for carrying out the method for producing convexes or concaves of the present invention will be explained.

Although the photosensitive film 10 may be one produced as a solid film consisting a single layer, it is preferable to use one prepared by applying a photosensitive resin composition on the base material (first base material) 11 and drying it, or by disposing the photosensitive film in contact with the base material 11. When it is formed on the base material 11, the photosensitive film 10 may be in a solid or liquid state.

As the photosensitive resin composition for forming the photosensitive film 10, resists and photocurable resins generally used in the field of photolithography can be used. Examples of resins to be insolubilized or solubilized by light include photosensitive polymers obtained by introducing a photosensitive group such as cinnamate residue, chalcone residue, acrylate residue, diazonium salt residue, phenylazide residue, o-quinoneazide residue, coumarin residue, 2,5-dimethoxystilbene residue, stylylpyridine residue, α-phenylmaleimide, anthracene residue and pyrone residue, into polyvinyl alcohols, novolac resins, acrylic resins, epoxy resins, and so forth.

Further, as the photocurable resin, photopolymerizable prepolymers which are cured by crosslinking upon light irradiation can be used. Examples of the photopolymerizable prepolymers include resins having acrylate groups such as epoxy acrylate, polyester acrylate, polyurethane acrylate and polyhydric alcohol acrylate, polythiol-polyene resins, and so forth. Although the photopolymerizable prepolymers may be used independently, photopolymerizable monomers may be added in order to improve the crosslinking-curable property and strength of film cured by crosslinking. Used as the photopolymerizable monomers are one or two or more kinds of monofunctional acrylic monomers such as 2-ethylhexyl acrylate, 2-hydroxyethyl acrylate, 2-hydroxypropyl acrylate and butoxyethyl acrylate, bifunctional acrylic monomers such as 1,6-hexanediol acrylate, neopentylglycol diacrylate, diethylene glycol diacrylate, polyethylene glycol diacrylate, and hydroxypivalic acid ester neopentylglycol diacrylate, polyfunctional acrylic monomers such as dipentaerythritol hexaacrylate, trimethylpropane triacrylate and pentaerythritol triacrylate, and so forth.

The photosensitive resin composition may contain a photopolymerization initiator, ultraviolet sensitizing agent and so forth, as required, in addition to the photosensitive polymer or the photopolymerizable prepolymer and the photopolymerizable monomer mentioned above. Usable as the photopolymerization initiator are radical type photopolymerization initiators such as those of benzoin ether type, ketal type, acetophenone type and thioxanthene type, cation type photopolymerization initiators such as those of diazonium salts, diaryliodonium salts, triarylsulfonium salts, triarylberyllium salts, benzylpyridinium thiocyanate, dialkylphenacylsulfonium salts, dialkylhydroxyphenylsulfonium salts, dialkylhydroxyphenylphosphonium salt, and complex type of these, and so forth. As the ultraviolet sensitizing agent, n-butylamine, triethylamine, tri-n-butylphosphine, and so forth can be used.

When the photosensitive film 10 on which surface convexes or concaves are formed is used as it is as an optical member such as a light diffusing film and a light control film, it is preferable to use a highly light transmitting material. As such a material, acrylic resins are especially preferred among the photocurable resins mentioned above. When convexes or concaves formed on the photosensitive film are used as a mold, or depending on the use of the member on which surface convexes or concaves are formed, the photosensitive film may be colored.

Thickness of the photosensitive film 10 is not particularly limited, and it is sufficient that it should be thicker than the height of convex (depth of concave) to be formed.

The material of the base material 11 is not particularly limited so long as a material transmitting light used for the light exposure is chosen, and a plate or film consisting of glass, plastics or the like can be used. Specifically, usable are plastic films or sheets of polyethylene terephthalate, polybutylene terephthalate, polyethylene naphthalate, polycarbonate, polypropylene, polyethylene, polyarylate, acrylic resin, acetyl cellulose, polyvinyl chloride, or the like. In view of dimensional stability, those subjected to stretching, in particular, biaxial stretching, are especially preferred.

Thickness of the base material 11 gives an interval between the light shielding surface 20a of the mask member 20 and the photosensitive film 10 as shown in FIG. 3, and it is suitably selected depending on the convexes or concaves to be formed on the photosensitive film 10.

Although the light diffusing member 30 may be one consisting of a single layer, when it is difficult to produce or handle such a member consisting of a single layer, the light diffusing layer may be formed on a base material. As the base material, those exemplified as the base material of the mask member can be used. The light diffusing member 30 or the light diffusing layer can be formed from spherical microparticles and a binder resin. Alternatively, the light diffusing member 30 may be one on which surface unevenness (convexes or concaves) are formed by matting treatment, embossing, etching or the like.

As the spherical microparticles, inorganic microparticles such as those of silica, alumina, talc, zirconia, zinc oxide, and titanium dioxide, and organic microparticles such as those of polymethyl methacrylate, polystyrene, polyurethane, benzoguanamine, and silicone resin can be used. Organic microparticles are particularly preferred in view of ease of obtaining spherical shape.

The binder resin may be one that is transparent and can uniformly retain the spherical microparticles in a dispersed state, and it is not limited to solid and may be a fluid such as liquid or liquid crystal. However, in order to maintain shape of the light diffusing layer by itself, it preferably consists of glass or a polymer resin.

Glass is not particularly limited so long as the light transmitting property of the light diffusing layer is not lost.

Examples of glass generally used include oxide glass such as silicate glass, phosphate glass and borate glass, and so forth. The polymer resin is not particularly limited so long as a polymer resin which does not degrades light transmitting property of the light diffusing layer is chosen, and usable as the polymer resin are thermoplastic resins, thermosetting resins, ionizing radiation hardening resins, such as polyester resins, acrylic resins, acrylic urethane resins, polyester acrylate resins, polyurethane acrylate resins, epoxy acrylate resins, urethane resins, epoxy resins, polycarbonate resins, cellulose resins, acetal resins, vinyl resins, polyethylene resins, polystyrene resins, polypropylene resins, polyamide resins, polyimide resins, melamine resins, phenol resins, silicone resins, and fluorocarbon resins, and so forth.

When surface unevenness are formed without using spherical microparticles, a surface of a sheet member consisting of a resin similar to those of the binder resin mentioned above is subjected to a matting treatment, embossing, or etching to make the surface uneven. In this case, the light diffusing member has only external haze, and the haze can be adjusted by changing magnitude of convexes or concaves of the unevenness. Although the magnitude of convexes or concaves should be changed depending on the objective haze, it is preferably in the range of 0.5 to 3.5 µm in terms of center line average roughness (Ra).

Haze H of the light diffusing member 30 utilizing spherical microparticles can be adjusted as follows. Internal haze can be adjusted by changing difference of refractive indexes of the spherical microparticles and the binder resin, mean particle diameter of the spherical microparticles, particle diameter distribution of the spherical microparticles, content of the spherical microparticles, and thickness of the light diffusing member. External haze can be adjusted by changing surface unevenness by adjusting mean particle diameter of the spherical microparticles, particle diameter distribution of the spherical microparticles, content of the spherical microparticles, and thickness of the light diffusing member.

As the mask member 20, photomasks generally used in the field of photolithography can be used. When the photosensitive film 10 is that of negative type, a mask member 20 in which many fine apertures (holes) corresponding to the objective pattern are formed is used. When the photosensitive film 10 is that of positive type, a mask member 20 on which light-shielding pattern corresponding to the objective pattern is formed is used. The apertures or light-shielding portions may have, for example, a circular shape or an elliptical shape, but the shape is not limited to them. The apertures or light-shielding portions may have a shape of elongated slit. The arrangement of the apertures or light-shielding portions may be different depending on the objective pattern, and it may be random or regular arrangement. The shape of the bottom of convex or concave becomes substantially the same as that of the shape of the aperture or light-shielding portion of the mask member 20.

The light source may be one emitting light of a wavelength for which the photosensitive resin composition mentioned above shows photosensitivity. Specifically, when a photosensitive resin reacting to ultraviolet radiation is used, UV ramps such as high pressure mercury vapor lamp, metal halide lamp and xenon lamp can be used.

Figure 9:
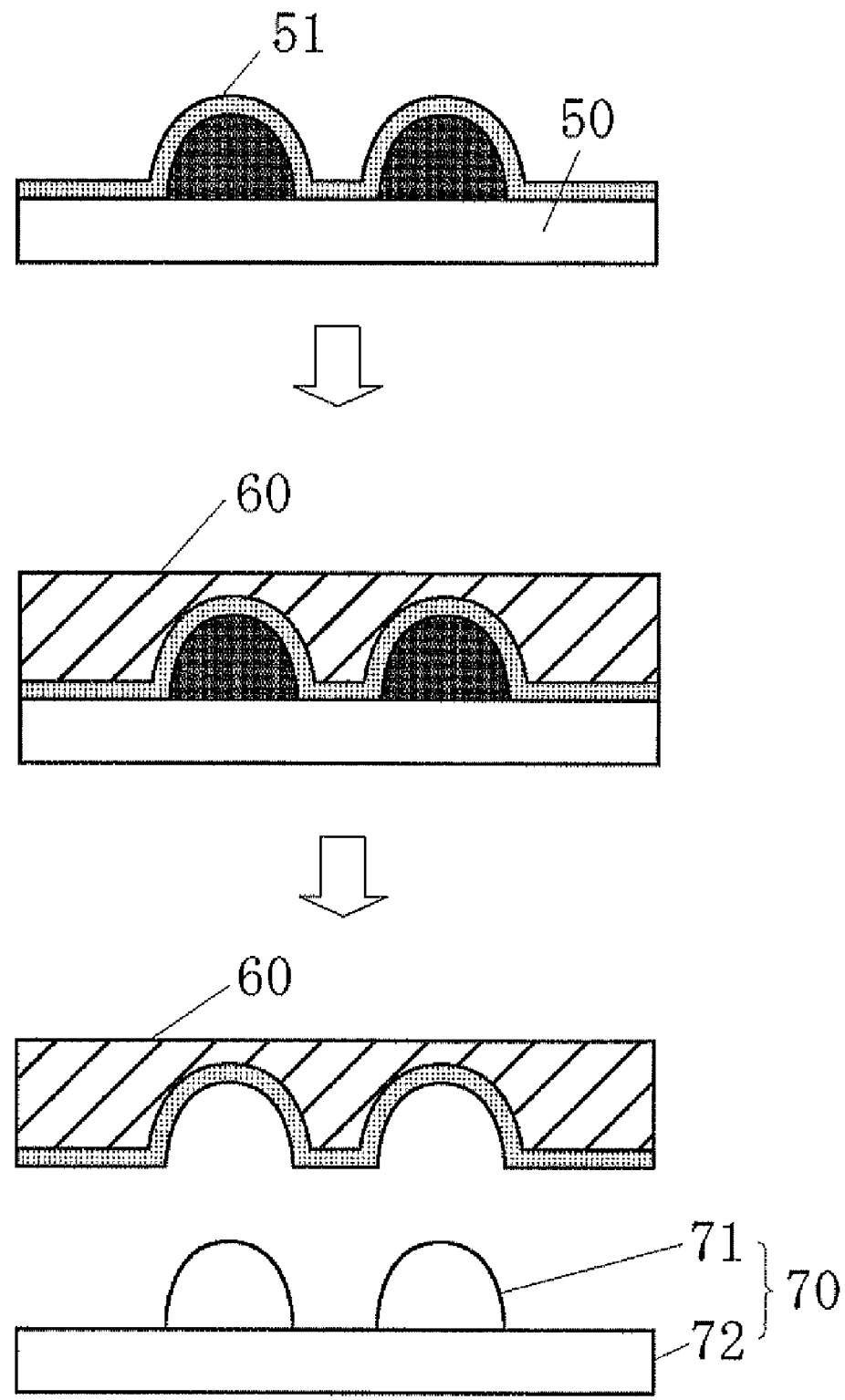

When the photosensitive film on which fine convexes or concaves are produced by the method for producing surface convexes or concaves of the present invention (called member having surface convexes or concaves) is transparent, it can be used as it is as an optical member, or used in combination with another optical member. Alternatively, as shown in FIG. 9, it is also possible to further produce an electrocasting mold 60 by using a member having surface convexes or concaves 50 produced by the method for producing surface convexes or concaves of the present invention as a mold and produce a large number of members 70 having the same surface profile as that of the member having surface convexes or concaves 50 with an arbitrary material by using the electrocasting mold 60. Specifically, a conductive film 51 is formed on the surface of the member having surface convexes or concaves 50 by sputtering or the like, then an electrocasting layer is formed on the surface of the conductive film 51 by a usual electrocasting method, and the member having surface convexes or concaves 50 is removed to produce the electrocasting mold 60. This electrocasting mold 60 is filled with, for example, a photocurable resin 71, then covered with a transparent film 72, and irradiated with light through the film 72 to cure the photocurable resin 71 and thereby form a member 70 having the same convexes or concaves as the surface convexes or concaves serving as an original.

Since the range of material selection is widened by using such an electrocasting mold 60, a material having superior characteristics required for a specific objective use (for example, optical member) can be chosen to easily produce a lot of the objective members on which convexes or concaves are highly precisely formed. For example, by using a transparent material as the material to be filled in the mold, optical members such as light diffusing panels, light control films and microlenses can be produced.

EXAMPLES

Hereafter, the present invention will be further explained with reference to examples.

Example 1

On a base material 11 consisting of a polyester film having a thickness of 100 µm (COSMOSHINE A4300, Toyobo, Co., Ltd., refractive index: 1.64), resist (EKIRESIN PER-800 RB-2203, Goo Chemical Co., Ltd.) was applied and dried to form a photosensitive film 10 having a thickness of 100 µm.

Separately, a film having a light diffusing member having external haze of 30% (LIGHT-UP TL2, Kimoto Co., Ltd.) was prepared.

Figure 10:
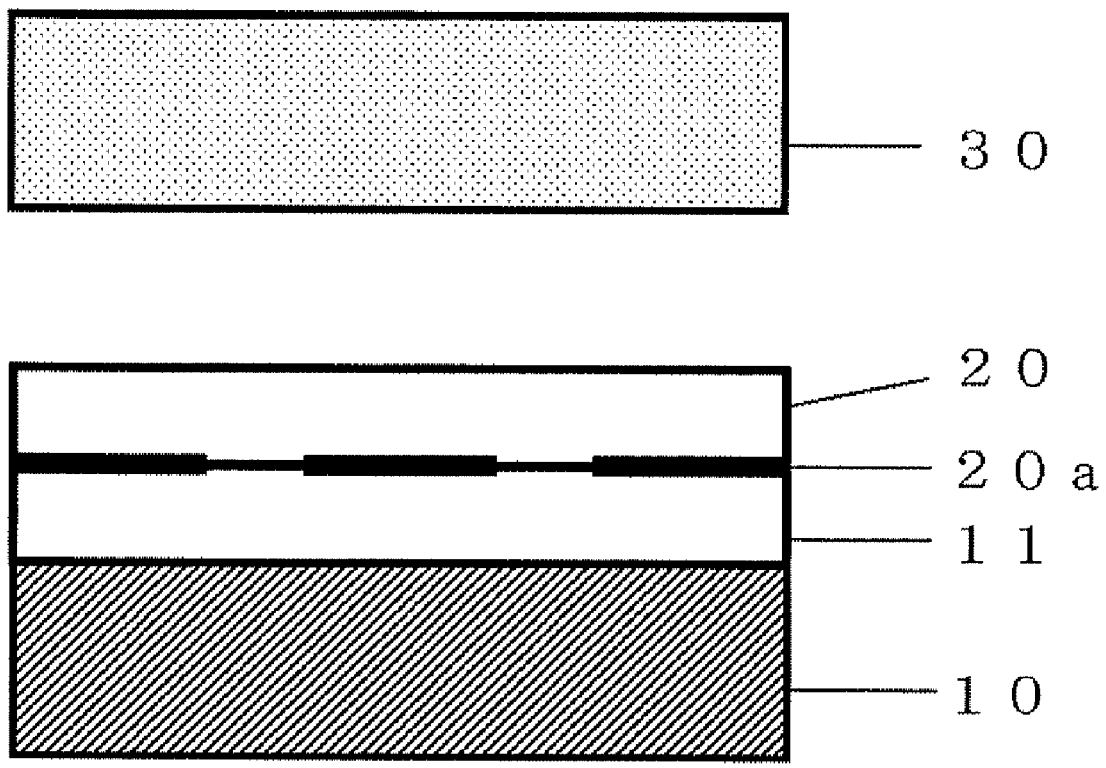

Then, the base material 11 for the photosensitive film 10 and a chromium mask 20 having multiple circular apertures (henceforth referred to as Cr mask) were superimposed so that the base material and a light shielding surface 20a of the Cr mask should face each other, the film having a light diffusing member 30 was disposed over the light shielding surface of the Cr mask with an interval of 8.3 mm (FIG. 10), and light exposure of the photosensitive film was performed from the Cr mask side under the following conditions. As the Cr mask, two kinds of Cr masks having aperture diameters of 30 µm and 40 µm were prepared, and light exposure was performed by using each of the masks.

<Light Exposure and Development>

The light exposure was performed by using a light exposure apparatus using a high pressure mercury vapor lamp as a light source (Jet Light JL-2300, ORC Manufacturing Co., Ltd.) with paralleling the light. Light amount for exposure was 100 mJ/cm$^2$, which was measured for light mainly of 365 nm with an integrating actinometer (UIT-102 (light receiving part: UVD-365PD), USHIO, INC.). After the light exposure, development was performed with a developing solution (1% aqueous solution of sodium carbonate), then the photosensitive film was washed with running water, and dried to obtain a sample in which convexes were formed on the base material surface.

Examples 2 to 5

Samples in which convexes were formed on the base material surfaces were obtained in the same manner as that used in Example 1 except that thickness of the polyester film serving as the base material 11 for the photosensitive film 10, and external haze of the light diffusing member 30 were changed as shown in Table 1. As the film having a light diffusing member of external haze of 65%, LIGHT-UP SP6 (trade name, Kimoto Co., Ltd.) was used, and as the film having a light diffusing member of external haze of 86%, LIGHT-UP DP8 (trade name, Kimoto Co., Ltd.) was used.

Example 6

A sample in which convexes were formed on a base material surface was obtained in the same manner as that used in Example 1, except that the film of Example 6 described below was used as the film having a light diffusing member.

On a base material consisting of a polyester film having a thickness of 50 μm (COSMOSHINE A4300, Toyobo, Co., Ltd.), a coating dispersion for light diffusing member having the following composition was applied in a thickness giving a dry thickness of 5 μm and dried, and the same polyester film was laminated on the light diffusing member to form a light diffusing member 30 having an internal haze of 5%, and thereby obtain a film having a light diffusing member (film of Example 6).

| <Coating dispersion for light diffusing member> | |
|---|---|
| Acrylic resin (ACRYDIC A-807, Dainippon Ink & Chemicals Inc. solid content: 50%) | 100 parts |
| Spherical microparticles (silica, Tospearl 105, GE Toshiba Silicones Co., Ltd., refractive index: 1.43, mean particle size: 0.5 pm) | 3 parts |
| Curing agent (Takenate D110N, Mitsui Chemicals Inc., solid content: 60%) | 19.5 parts |
| Ethyl acetate | 100 parts |
| Toluene | 100 parts |

Examples 7 to 10

Samples in which convexes were formed on the base material surfaces were obtained in the same manner as that used in Example 6 except that thickness of the polyester film serving as the base material 11 for the photosensitive film 10, and internal haze of the light diffusing member 30 were changed as shown in Table 1. In Examples 7 to 10, the haze values of 17% and 29% were obtained by changing the amount of the spherical microparticles in the coating dispersion for light diffusing member of Example 6 to 10 parts and 23 parts, with using the same thickness of the light diffusing member of Example 6, 5 μm.

The distances T used in Examples 1 to 10 are also shown in Table 1. The values of T/N, wherein N is refractive index of the medium existing between the light shielding surface of the mask member and the photosensitive film, are also shown in Table 1.

TABLE 1

| | Thickness of base material 11 | Haze (H) | Distance (T) | T/N |
|---|---|---|---|---|
| Example 1 | 100 μm | External, 30% | 100 μm | 61 μm |
| Example 2 | 100 μm | External, 65% | 100 μm | 61 μm |
| Example 3 | 100 μm | External, 86% | 100 μm | 61 μm |
| Example 4 | 50 μm | External, 30% | 50 μm | 30 μm |
| Example 5 | 250 μm | External, 30% | 250 μm | 152 μm |
| Example 6 | 100 μm | Internal, 5% | 100 μm | 61 μm |
| Example 7 | 100 μm | Internal, 17% | 100 μm | 61 μm |
| Example 8 | 100 μm | Internal, 29% | 100 μm | 61 μm |
| Example 9 | 50 μm | Internal, 29% | 50 μm | 30 μm |
| Example 10 | 250 μm | Internal, 29% | 250 μm | 152 μm |

The surface profiles of the samples obtained in Examples 1 to 10 were measured with a laser microscope (VK-9500, KEYENCE CORP.). Sectional shapes of the convexes obtained in Examples 1 to 3 are shown in FIG. 4 (those obtained in Examples 1, 2 and 3 are shown in the lower row, middle row and upper row of FIG. 4, respectively), those obtained in Examples 4 and 5 are shown in FIG. 6 (those obtained in Examples 4 and 5 are shown in the lower row and upper row of FIG. 6, and those obtained in Example 1 are shown in the middle row of FIG. 6 as reference), those obtained in Examples 6 to 8 are shown in FIG. 5 (those obtained in Examples 6, 7 and 8 are shown in the lower row, middle row and upper row of FIG. 5, respectively), and those obtained in Examples 9 and 10 are shown in FIG. 7 (those obtained in Examples 9 and 10 are shown in the lower row and upper row of FIG. 7, and those obtained in Example 8 are shown in the middle row of FIG. 7 as reference).

In Examples 1 to 3, the distance T (T/N) was fixed, and the value of haze (external haze) H was changed. As shown in FIG. 4, with increase of the value of haze H, spread of light became larger, therefore heights of the surface convexes in the samples obtained in Examples 1 to 3 became lower, and lengths of the slopes thereof became longer.

In Examples 4 and 5, the haze (external haze) H was fixed, and the distance T (T/N) was changed. As shown in FIG. 6, with increase of the distance T, spread of light became larger, therefore heights of the convexes in the samples obtained in Examples 4 and 5 became lower, and lengths of the slopes thereof became longer.

In Examples 6 to 8, the distance T (T/N) was fixed, and the value of haze (internal haze) H was changed. As shown in FIG. 5, with increase of the value of haze H, spread of light became larger, therefore heights of the convexes in the samples obtained in Examples 6 to 8 became lower, and lengths of the slopes became longer.

In Examples 9 and 10, the haze (internal haze) H was fixed, and the distance T (T/N) was changed. As shown in FIG. 7, with increase of the distance T, spread of light became larger, therefore heights of the convexes in the samples obtained in Examples 9 and 10 became lower, and lengths of the slopes became longer, However, when T=250 μm (T/N=152 μm), the light unduly spread, and the amount of light did not reach the critical light exposure at portions of foot having a small inclination. Therefore, the photosensitive resin could not sufficiently cure, and the bottom was smaller than that obtained with T of 100 μm.

Example 11

The procedures of Examples 1 to 10 up to the light exposure were repeated except that the base material 11 (first base material) for the photosensitive film 10 was changed to a polyester film having a thickness of 100 μm (trade name: Lumirror T60, Toray Industries, Inc., refractive index: 1.64). After completion of the light exposure, the polyester film was delaminated, and the surface of the photosensitive film 10 exposed by the delamination was adhered to an aluminum plate (second base material) with adhesive. Then, development, washing with water and drying were performed in the same manner as that of Examples 1 to 10 to obtain 10 kinds of samples of aluminum plate on which surface convexes were formed.

The surface profiles of the samples obtained in this example were substantially the same as those obtained in Examples 1 to 10 under the same conditions. On the basis of these results, it was demonstrated that convexes or concaves could be formed on another base material by adhering a surface of the photosensitive film 10 on the mask member side to the other base material after the light exposure and performing the development. Therefore, it is possible to form convexes or concaves even on a base material which does not transmit light by using the method of the present invention.

Example 12

On the surfaces having convexes of the samples produced in Examples 1 to 10, a two-pack type curable silicone resin (KE-108, curing agent: CAT-108, Shin-Etsu Chemical Co., Ltd.) was poured and cured, and then the surface having convexes was delaminated to obtain silicone resins on which surface concaves were formed.

The surface concaves of the silicone resins obtained in this example had shapes of concaves complementary to the original surface convexes.

Example 13

On a surface of each sample produced in Examples 1 to 10, a nickel thin film 51 was formed by sputtering as shown in FIG. 9 to make the surface conductive. On this surface, a nickel layer 60 was formed by a usual nickel electrocasting method. The surface of this nickel layer 60 had concave shapes complementary to those of the original surface convexes. Furthermore, by filling this nickel layer 60 as a mold with a photo-curable resin 71, covering it with a transparent polyester film 72, and irradiating light through the polyester film 72 to cure the photo-curable resin 71, a surface profile having the same convexes as those of the original surface convexes could be formed on the polyester film 72.

The invention claimed is:

1. A method for producing fine convexes or concaves on a surface of a material, which comprises the step of disposing a mask member having light transmitting sections and non-light transmitting sections over one side of a photosensitive film consisting of a photosensitive resin composition with an interval with respect to the photosensitive film, the step of disposing a light diffusing member on the opposite side of the photosensitive film across the mask member, the step of exposing the photosensitive film through the light diffusing member and the light transmitting sections of the mask member by irradiating light from a light source disposed on the opposite side of the mask member across the light diffusing member, and the step of removing exposed portions or unexposed portions of the photosensitive film by development to produce convexes or concaves on the photosensitive film in shapes determined by shapes of the exposed portions or unexposed portions, wherein in the step of exposure, light exposure conditions are controlled so as to control the shapes of the exposed portions or unexposed portions,
wherein the photosensitive film is formed on or disposed in contact with a substantially transparent first base material, and the exposure is performed from the side of the first base material.

2. The method for producing surface convexes or concaves according to claim 1, wherein the light exposure conditions include haze (JIS K7136:2000) of the light diffusing member.

3. The method for producing surface convexes or concaves according to claim 2, wherein the light exposure conditions include distance from a light shielding surface of the mask member to the photosensitive film.

4. The method for producing surface convexes or concaves according to claim 1, wherein the photosensitive film consists of a negative type photosensitive resin composition which is insolubilized by light exposure.

5. The method for producing surface convexes or concaves according to claim 1, wherein, after the step of exposure, the surface of the photosensitive film on the mask member side is adhered to a second base material, and then development is performed to produce a surface having convexes or concaves on the second base material.

6. A method for producing a member having surface convexes or concaves by using a mold having fine surface convexes or concaves so that the member should have surface convexes or concaves in shapes complementary to shapes of the surface convexes or concaves formed on the mold, wherein a mold produced by the method for producing surface convexes or concaves according to claim 1 is used as the mold.

7. The method for producing surface convexes or concaves according to claim 6, wherein the member on which surface convexes or concaves are formed is an optical member.

8. A method for producing a member having surface convexes or concaves by using a mold having fine surface convexes or concaves so that the member should have surface convexes or concaves in shapes complementary to shapes of the surface convexes or concaves formed on the mold, wherein a second mold produced by using a first mold produced by the method for producing surface convexes or concaves according to claim 1 is used as the mold to produce the member having convexes or concaves in the same shapes as those of the first mold.

9. The method for producing surface convexes or concaves according to claim 8, wherein the member on which surface convexes or concaves are formed is an optical member.

10. The method for producing surface convexes or concaves according to claim 1, wherein the member on which surface convexes or concaves are formed is an optical member.

11. The method for producing surface convexes and concaves according to claim 1, wherein the base material consists of glass or plastics.

12. The method for producing surface convexes and concaves according to claim 1, wherein the light exposure conditions include the thickness of the base material.

13. The method for producing surface convexes and concaves according to claim 1, wherein the light exposure conditions include T/N, where T is a distance from a light shielding surface of the mask member to the photosensitive film and N is a refractive index of a medium existing between the light shielding surface of the mask member and the photosensitive film.

* * * * *